US010224885B2

(12) United States Patent
Forstner et al.

(10) Patent No.: US 10,224,885 B2
(45) Date of Patent: Mar. 5, 2019

(54) DIFFERENTIAL LOGIC WITH LOW VOLTAGE SUPPLY

(71) Applicant: Infineon Technologies AG, Neubiberg (DE)

(72) Inventors: Johann Peter Forstner, Steinhoering (DE); Vadim Issakov, Munich (DE); Saverio Trotta, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/679,869

(22) Filed: Aug. 17, 2017

(65) Prior Publication Data
US 2018/0054200 A1 Feb. 22, 2018

(30) Foreign Application Priority Data

Aug. 17, 2016 (DE) .................. 10 2016 115 287

(51) Int. Cl.
H03F 3/45 (2006.01)
H03K 3/2885 (2006.01)
(Continued)

(52) U.S. Cl.
CPC ....... *H03F 3/45085* (2013.01); *H03F 1/0205* (2013.01); *H03K 3/012* (2013.01);
(Continued)

(58) Field of Classification Search
CPC ........ H03K 3/012; H03K 3/286; H03K 3/288; H03K 3/2885; H03K 19/01812;
(Continued)

(56) References Cited

U.S. PATENT DOCUMENTS 6,268,752 B1  7/2001  Takahashi et al.
6,559,693 B2  5/2003  Tung et al.
(Continued)

FOREIGN PATENT DOCUMENTS

DE  102004009283 B4  4/2006
DE      10319089 B4  5/2008
WO    2005029703 A1  3/2005

OTHER PUBLICATIONS

Chien et al., "Ultra-Low-Voltage CMOS Static Frequency Divider", Graduate Institute of Electronics Engineering, National Taiwan University, Taipei, TW, IEEE 0-7803-9162-4/05, 2005, pp. 209-212.
(Continued)

*Primary Examiner* — Patrick O Neill
(74) *Attorney, Agent, or Firm* — Slater Matsil, LLP

(57) ABSTRACT

In accordance with an embodiment, a method includes receiving a first differential logic signal using a first branch of a circuit that extends from a voltage supply of the circuit as far as an earth terminal of the circuit and has at least one first differential transistor pair, receiving a second differential logic signal using a second branch of the circuit that extends from the voltage supply to the earth terminal and has at least one second differential transistor pair, conducting a current flow between the first branch and the second branch, and outputting an output signal by the second branch.

23 Claims, 11 Drawing Sheets

(51) Int. Cl.
  *H03K 21/02* (2006.01)
  *H03K 3/012* (2006.01)
  *H03F 1/02* (2006.01)

(52) U.S. Cl.
  CPC ......... *H03K 3/2885* (2013.01); *H03K 21/023* (2013.01); *H03F 2200/513* (2013.01)

(58) Field of Classification Search
  CPC .... H03K 21/023; H03K 23/002; H03K 23/50; H03K 23/52; H03F 1/0205; H03F 3/45085; H03F 2200/513
  See application file for complete search history.

(56) References Cited

U.S. PATENT DOCUMENTS

| | | | | |
|---|---|---|---|---|
| 6,614,291 | B1* | 9/2003 | Zhao | H03K 3/012 |
| | | | | 326/115 |
| 7,161,395 | B2* | 1/2007 | Xie | H03K 3/012 |
| | | | | 327/115 |
| 7,236,029 | B2 | 6/2007 | Gossmann | |
| 7,626,433 | B2 | 12/2009 | Hoess | |
| 7,688,125 | B2* | 3/2010 | Payne | H03K 3/2885 |
| | | | | 327/199 |
| 8,410,831 | B2* | 4/2013 | Mukherjee | H03B 19/14 |
| | | | | 327/115 |
| 2007/0018693 | A1 | 1/2007 | Chen | |
| 2007/0024330 | A1 | 2/2007 | Mirzaei et al. | |

OTHER PUBLICATIONS

Kucharski et al., "A 40GHz 2.1V Static Frequency Divider in SiGe Using a Low-Voltage Latch Topology", Cornell University, Ithaca, NY, RTU3B-1, 2005 IEEE Radio Frequency Integrated Circuits Symposium, 0-7803-8983-2/05, pp. 461-464.

Kuo et al., "Admittance-Transforming Injection-Locked Frequency Divider and Low-Supply-Voltage Current Mode Logic Divider", Dept. of Electrical Engineering and Graduate Institute of Communication Engineering National Taiwan University, Taipei, TW, Proceedings of Asia-Pacific Microwave Conference 2010, TH2E-4, pp. 782-785.

Lao et al., "1.3V Supply Voltage 38 GHz Static Frequency Divider", Electronics Letters Mar. 4, 2004, vol. 40 No. 5, 2 pages.

Razavi et al., "Design Techniques for Low-Voltage High-Speed Digital Bipolar Circuits", IEEE Journal of Solid-State Circuits, vol. 29, No. 3, Mar. 1994, pp. 332-339.

Rylov et al., "Static Bipolar 11 GHz SiGe Divider with 1V Power Supply", IBM T.J. Watson Research Center, Yorktown Heights, NY, IEEE BCTM 4.4 0-7803-7800-8/03, 2003, pp. 79-81.

Wang et al., "An 8 to 9 GHz LC-VCO and Harmonic-Suppressed CML Divider With Low Supply Voltage for FMCW Synthesizer", State Key Laboratory of ASIC & System, Fudan University Shanghai, CN, 2014, IEEE 978-1-4799-3282-5/14, 3 pages.

Winkler et al., "High-Performance and Low-Voltage Divider Circuits Fabricated in SiGe:C HBT Technology", ESSCIRC 2002, pp. 827-830.

* cited by examiner

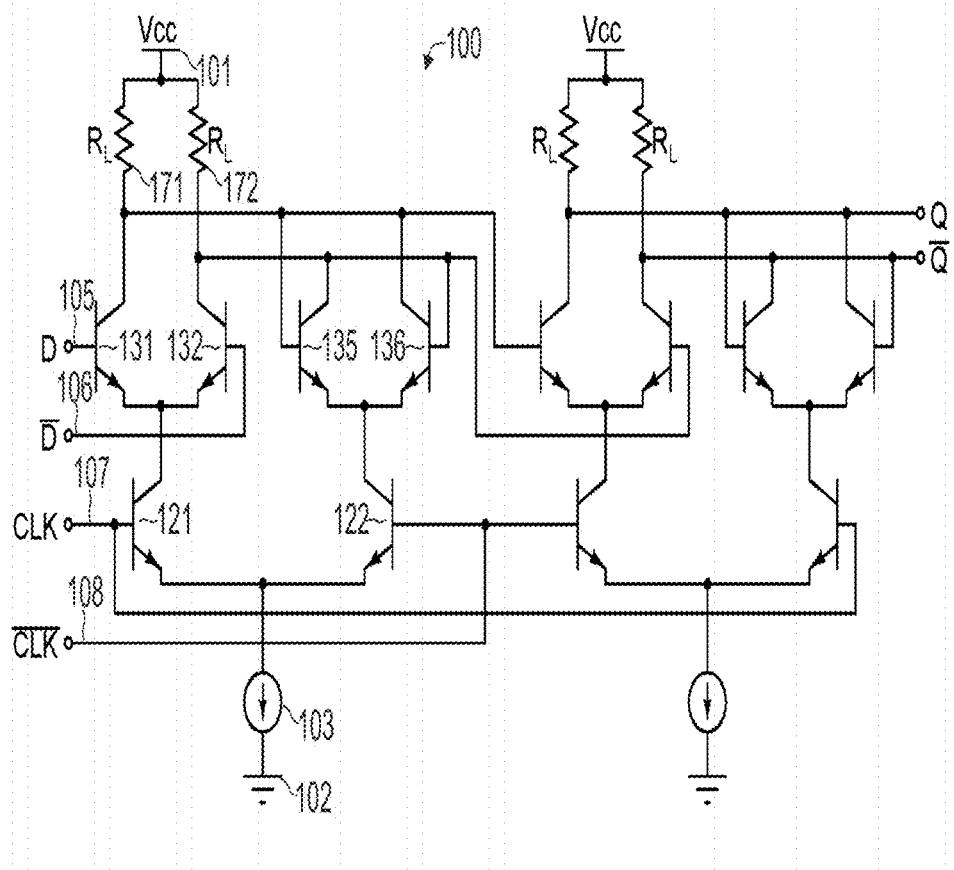

DIFFERENTIAL LOGIC WITH LOW VOLTAGE SUPPLY

This application claims priority to German patent application No. 102016115287.0, filed on Aug. 17, 2016, which application is hereby incorporated herein by reference in its entirety.

TECHNICAL FIELD

The present invention relates to a system and method for differential logic with a low voltage power supply.

BACKGROUND

So-called current mode logic (CML) makes it possible to implement digital logic circuits. CML is based on the differential transmission of logic signals. This makes possible—despite typically low signal amplitudes—good interference immunity.

CML is also suitable for enabling reliable operation at comparatively high frequencies of the logic signals. By way of example, static frequency dividers in the millimeter wave regime are typically implemented using CML.

On the other hand, CML has certain disadvantages and limitations. By way of example, in the case of CML it may be necessary to choose the supply voltage of the voltage supply to be greater than or equal to a minimum value. The minimum value can be defined by the number of required transistors cascaded or stacked one on top of another in circuit branches between the voltage supply and earth. Particularly with the use of bipolar transistors, such as, for example, the heterojunction bipolar transistor (HBT), for instance using silicon germanium (SiGe) technology, the minimum value may have a significant magnitude. By way of example, the supply voltage may be 3.3 V in typical reference implementations.

On account of the significant minimum value for the supply voltage, a corresponding CML circuit may have a high DC power consumption. However, there are many applications in which a comparatively low DC power consumption is desirable.

SUMMARY

In one example, a circuit comprises a voltage supply and an earth terminal. The circuit also comprises a first input terminal. The first input terminal is configured to receive a first differential logic signal. The circuit also comprises a second input terminal. The second input terminal is configured to receive a second differential logic signal. The circuit comprises a first branch and a second branch. The first branch extends from the voltage supply to the earth terminal and has at least one first differential transistor pair. The first branch is coupled to the first input terminal. The second branch also extends from the voltage supply to the earth terminal and has at least one second differential transistor pair. The second branch is coupled to the second input terminal. The circuit also comprises an interface between the first branch and the second branch. The interface is configured to conduct a current flow between the first branch and the second branch. The circuit also comprises an output terminal, which is coupled to the second branch and which is configured to output an output signal.

In one example, a method comprises receiving a first differential logic signal by means of a first branch of a circuit. The first branch extends from a voltage supply of the circuit as far as an earth terminal of the circuit. The first branch has at least one first differential transistor pair. The method furthermore comprises receiving a second differential logic signal by means of a second branch of the circuit. The second branch extends from the voltage supply to the earth terminal. The second branch has at least one second differential transistor pair. The method furthermore comprises conducting a current flow between the first branch and the second branch. The method furthermore comprises outputting an output signal by the second branch.

The features set out above and features described below can be used not only in the corresponding combinations explicitly set out, but also in further combinations or in isolation, without departing from the scope of protection of the present invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a static frequency divider circuit in accordance with reference implementations in CML, wherein the frequency divider circuit comprises the circuit according to FIG. 1.

DETAILED DESCRIPTION OF ILLUSTRATIVE EMBODIMENTS

Figure 1:
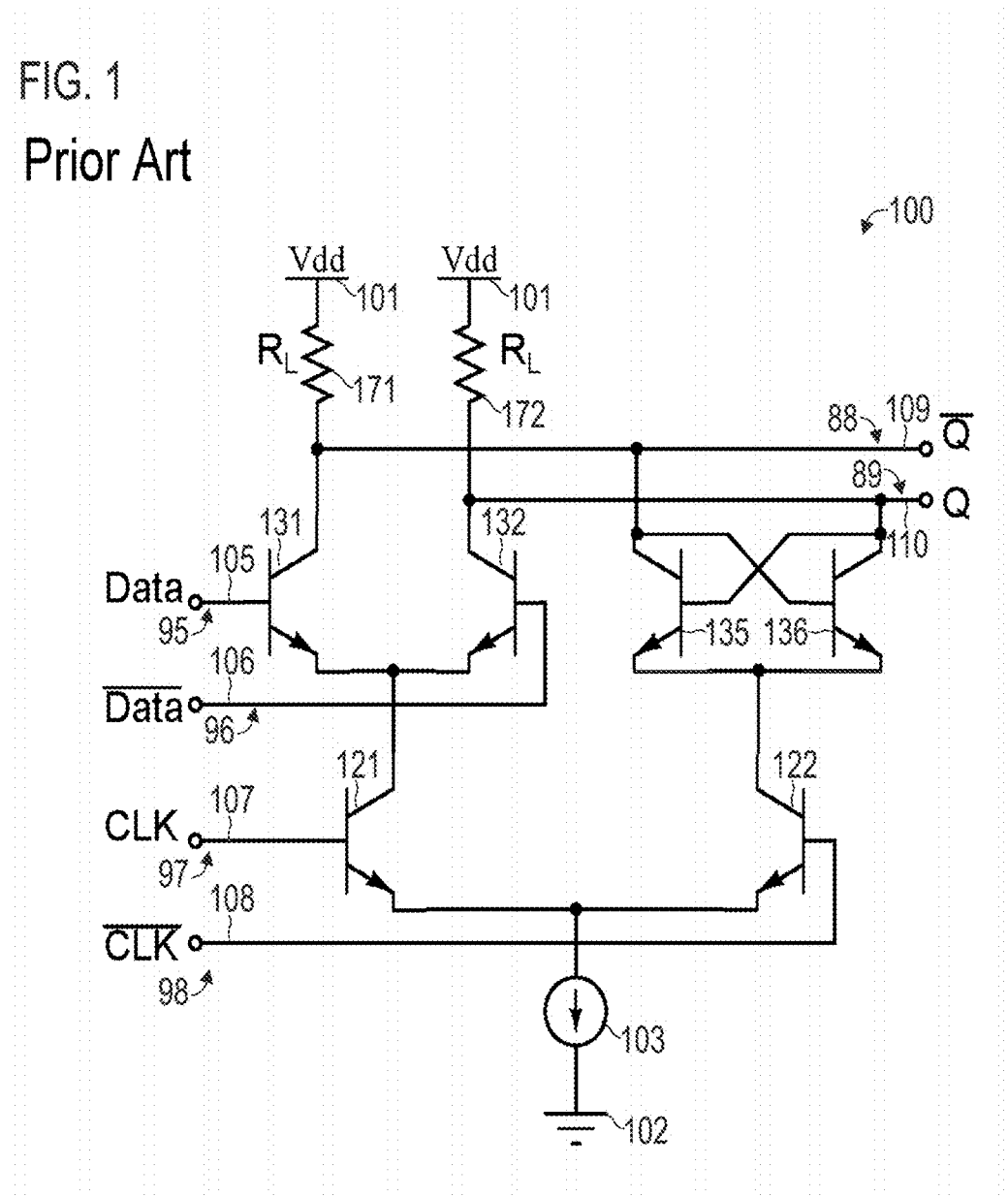
FIG. 1 schematically illustrates a circuit in accordance with reference implementations in CML.

The above-described properties, features and advantages of this invention and the way in which they are achieved will become clearer and more clearly understood in association with the following description of the exemplary embodiments which are explained in greater detail in association with the drawings.

Various examples are directed toward improved differential logic circuits. Various examples relate to a circuit comprising a first input terminal and a second input terminal. The first and second input terminals are in each case configured to receive a corresponding differential logic signal. The first and second input terminals are assigned in each case to a branch between voltage supply and earth terminal of the circuit. The branches each have at least one differential transistor pair. An interface is arranged between the first branch and the second branch.

The present invention is explained in greater detail below on the basis of preferred embodiments with reference to the drawings. In the figures, identical reference signs designate identical or similar elements. The figures are schematic representations of various embodiments of the invention. Elements illustrated in the figures are not necessarily illustrated in a manner true to scale. Rather, the various elements illustrated in the figures are rendered in such a way that their function and general purpose becomes understandable to the person skilled in the art.

A description is given below of techniques for electronic circuits by means of which logic operations can be implemented. In various examples, current-switched circuits are described.

A description is given below of techniques in which logic signals can be processed as differential signal pairs. To that end, one or a plurality of input terminals can be provided, each of which is configured to receive a corresponding differential logic signal (differential input). One or a plurality of output terminals can also be provided, each of which can be configured e.g. to output a corresponding differential logic signal (differential output).

Various examples relate, in particular, to the implementation of logic gate circuits in which a plurality of differential logic signals (input signals) are received and e.g. one or a plurality of differential logic signals (output signals) are output on the basis of the plurality of input signals. The logic gate circuits can thus implement logical combinations between the plurality of input signals.

Various examples relate to circuits which are configured to process input signals having frequency components of more than 3 GHz, or more than 30 GHz, or more than 300 GHz. Various examples relate to circuits which are configured to output signals having frequency components of more than 3 GHz, or more than 30 GHz, or more than 300 GHz. The input signal and/or the output signal can lie in the millimeter wave frequency range.

In various examples, each input signal is assigned a branch of the circuit, which branch extends in each case between the voltage terminal for the supply voltage (voltage supply) and the earth terminal. The different branches can be coupled via an interface. The interface can be configured to enable a current flow between the branches. At the same time, the interface can be configured to bring about a DC isolation of the branches. The interface can thus be configured to enable a differential AC current flow between the branches, e.g. a radio-frequency AC current flow. By way of example, the interface can comprise one or a plurality of capacitors for this purpose. The current flow can have frequency components corresponding to the frequency components of one or a plurality of the input signals.

Providing a plurality of branches makes it possible to limit the number of transistors per branch. In particular, it is possible to limit the number of cascaded-connected transistors per branch. A particularly low supply voltage can be chosen as a result. In particular, it is possible to reduce the number of transistors per branch in comparison with a corresponding implementation of the logic in CML. Particularly energy-efficient operation of the circuit can be achieved as a result.

The techniques described herein can be employed for various circuits, in particular for various logic gate circuits. Examples of circuits include: static frequency dividers; AND; NOR; XOR; multiplexer; multipliers; latch; D-latch; etc.

The techniques described herein can be used with different switching elements. In particular, the techniques described herein can be used with different active component types. The techniques described herein can be used with different transistor types. By way of example, bipolar transistors, in particular HBTs, or field effect transistors (FETs) can be used. By way of example, a metal oxide FET (MOSFET) can be used. By way of example, the circuits can be implemented using complementary metal oxide semiconductor (CMOS) technology. The circuits can also be implemented using SiGe technology. In some examples, it may be possible in this way to overcome limitations of conventional CML using SiGe technology, e.g. concerning the possibility of arranging a plurality of HBTs in a cascaded manner.

Various examples can be understood as further development of CML. In this case—in accordance with CML—current flows can be switched. On the other hand, the different differential inputs can be assigned to separate branches—instead of to one common branch.

FIG. 1 illustrates aspects with regard to a circuit 100 in CML in accordance with reference implementations. A differential input 107, 108 receives an input signal 96, 97 (designated by CLK, −CLK in FIG. 1). A differential input 105, 106 receives an input signal 95, 96 (designated by DATA, −DATA, in FIG. 1). The input signal 97, 98 is fed to a differential transistor pair 121, 122. The input signal 95, 96 is fed to a differential transistor pair 131, 132. Moreover, the cross-coupled differential transistor pair 135, 136 is also present. By way of example, the transistors 121, 122, 131, 132, 135, 136 could be implemented as HBTs.

Load resistors 171, 172 are arranged in a manner adjacent to the voltage supply in a customary way. Moreover, a current source 103 arranged adjacent to the earth terminal 102 (referred to as tail current source) is illustrated.

The circuit 100 can implement e.g. a latch functionality with regard to the two input signals 95-98 and output a corresponding output signal 88, 89 (designated by −Q, Q in FIG. 1) via a corresponding output 109, 110. In particular, the circuit 100 can implement a D-latch functionality. The circuit 100 connected e.g. in a static frequency divider or a master-slave D-latch can then be used as a flip-flop in accordance with FIG. 2A. A negative feedback is used here (dashed line in FIG. 2B). See Razavi, Behzad, Kwing F. Lee, and Ran H. Yan. "Design of high-speed, low-power frequency dividers and phase-locked loops in deep submicron CMOS." IEEE Journal of Solid-State Circuits 30.2 (1995): 101-109, in particular FIG. 6.

Figure 2B:
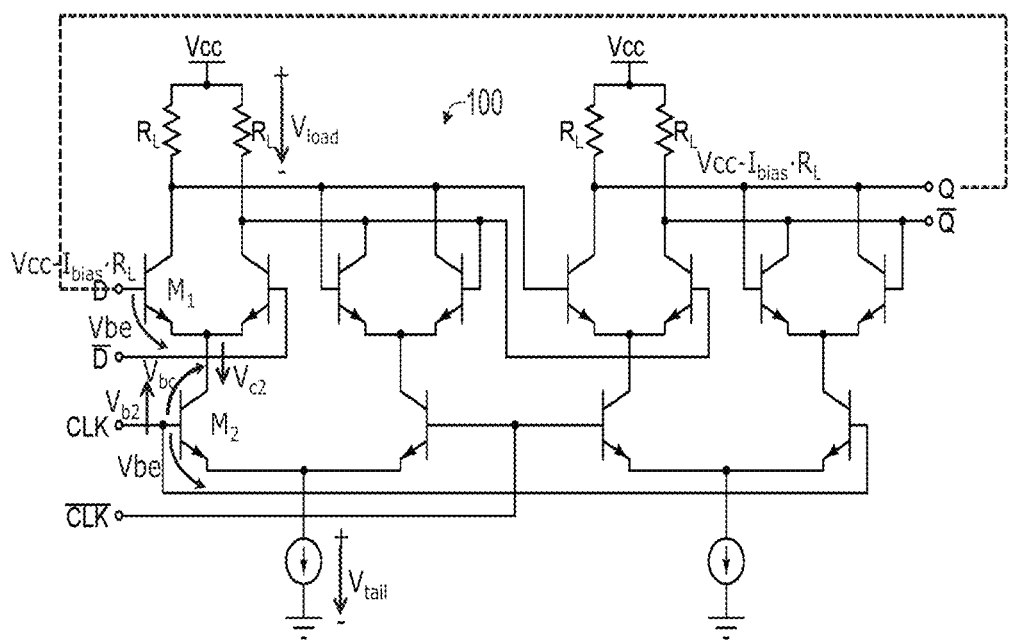
FIG. 2B schematically illustrates voltages at the operating point of the frequency divider circuit from FIG. 2A.

FIG. 2B corresponds to FIG. 2A, only voltages at the operating point being depicted, for reasons of clarity. By means of FIG. 2B, a consideration of the DC operating point makes it possible to give plausibility to why for the CML a minimum value for the supply voltage exists in order to enable operation of the frequency divider as intended. This is explained below.

The potential at the emitter of transistor 131 is $V_{CC}$-$V_{load}$-$V_{be}$. The same potential is also present at the collector of transistor 121.

Typically, $V_{load} \geq 150$ mV, in order to achieve an adequate voltage swing. Moreover, for typical transistors the base-emitter voltage $V_{be} \approx 0.8$ V.

The following should hold true for the potential at the base of transistor 121: $V_{be}+V_{tail}>0.8$ V+0.15 V=0.95 V.

By way of example, if the supply voltage $V_{CC}$ is chosen to be small, that is to say e.g. $V_{CC}=1.5$ V, then the potential at the collector of transistor 121 with the equations above results as 1.5 V−(0.8 V+0.15 V)=0.45 V. This is 0.5 V below the potential at the base of transistor 121. The base-collector junction of the transistor 121 is thus forward-biased. This has the effect that the circuit 100 and thus the frequency divider can no longer be operated as intended.

It is evident from the above that it is not possible to operate the circuit 100 in conventional CML logic with a supply voltage of $V_{CC}$=1.5 V. Therefore, greater supply voltages, e.g. $V_{CC}$=3.3 V, are usually used.

A description is given below of techniques which make it possible to use a particularly low supply voltage.

Figure 3:
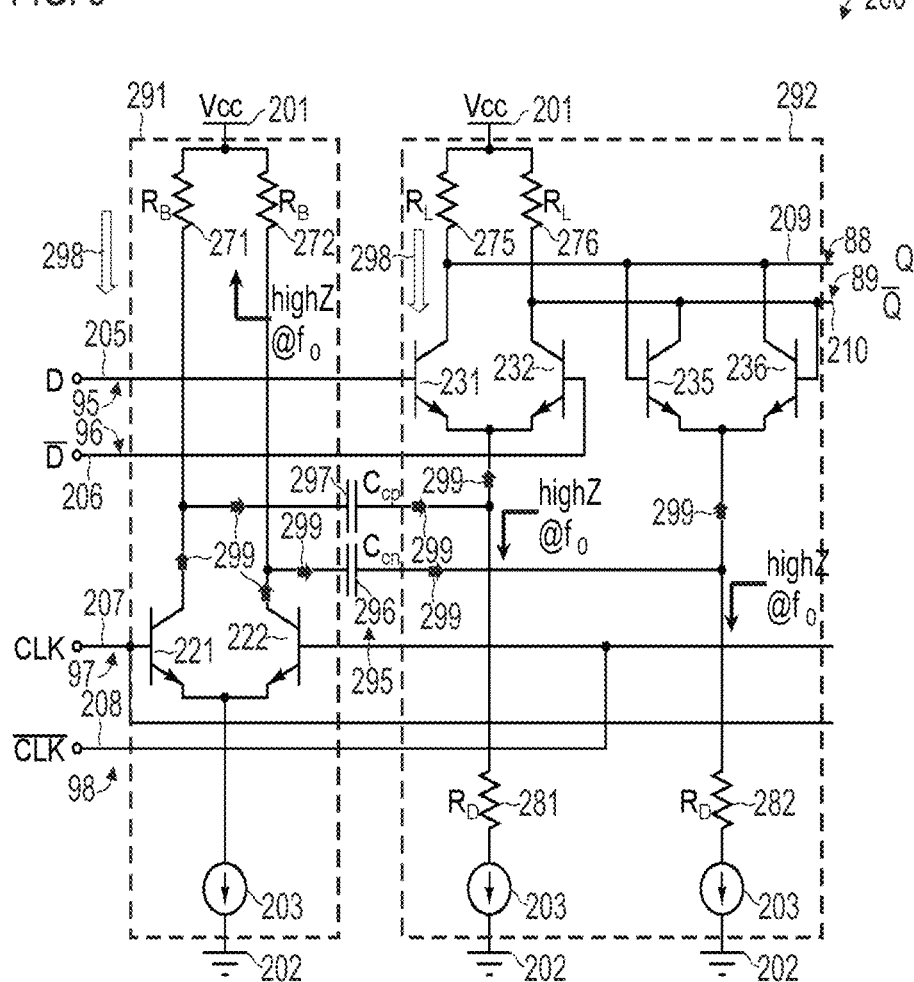
FIG. 3 schematically illustrates a circuit in accordance with various embodiments.

FIG. 3 illustrates aspects of a circuit 200 having a plurality of branches 291, 292 for the various differential inputs 205-208. The circuit 200 has a functionality corresponding to the functionality of the circuit 100 in FIG. 1. The circuit 200 implements a D-latch. A corresponding output signal 88, 89 is output via the output 209, 210.

The circuit 200 in turn comprises three differential transistor pairs 221, 222; 231, 232; and 235, 236. In this case, the differential transistor pair 221, 222 is assigned to the branch 291. The differential transistor pairs 231, 232 and 235, 236 are connected in parallel and assigned to the branch 292. In this case, the input signal 97, 98 is fed to the differential transistor pair 221, 222 of the branch 291 via the differential input 207, 208. In this case, the differential input signal 95, 96 is fed to the differential transistor pair 231, 232 via the differential input 205, 206. Only the transistor pair 235, 236 is cross-coupled. The branch 291 furthermore has a current source 203, which is coupled to the branch 291 on the earth side. Correspondingly, the branch 292 also has a current source 203 coupled on the earth side (FIG. 3 illustrates an implementation with two current sources 203 for the branch 292).

The two branches 291, 292 are coupled via an interface 295 of the circuit 200. The interface 295 is configured to conduct a current flow 299 between the branches 291, 292 (FIG. 3 illustrates, in particular, the current flow 299 from the branch 291 to the branch 292).

What is achieved as a result is that the transistor pair 221, 222 switches the current flow 299—instead of directly switching the transistor pair 231, 232 in accordance with CML reference implementations.

In this case, the interface 295 comprises a differential conductor pair with capacitors 296, 297. Each of the two conductors of the differential conductor pair comprises a corresponding assigned capacitor 296, 297. As a result, a DC current flow 298 is not conducted via the interface 295. Rather, the interface 295 is configured to conduct a differential AC current flow 299, between the branches 291, 292.

In this case, a first conductor of the interface 295—with the capacitor 297—is coupled to the differential transistor pair 231, 232; while a second conductor of the interface 295—with the capacitor 296—is coupled to the differential transistor pair 235, 236. The different conductors of the interface are also assigned to different transistors 221, 222.

It is evident from FIG. 3 that each of the branches 291, 292 extends in each case from the voltage supply 201 to the earth terminal 202. None of the branches 291, 292 has a series connection of bipolar transistors. As a result, it is possible to use particularly low supply voltages.

The circuit 200 enables the implementation of the latch functionality in a manner corresponding to the circuit 100 in accordance with FIG. 1. In this case, however, a particularly low supply voltage $V_{CC}$ can be used on account of the avoidance of a series connection of bipolar transistors between the voltage supply 201 and the earth terminal 202. At the same time, the performance characteristic of the circuit 200 is not compromised relative to the performance characteristic of the circuit 100 in CML. In particular, it is possible to achieve a particularly high power supply rejection ratio (PSRR) and a particularly high common-mode rejection ratio (CMRR).

The interface 295 is coupled to the branch 291 between the voltage supply 201 and the differential transistor pair 221, 222. The interface 295 is coupled to the branch 292 between the earth terminal 202 and the differential transistor pairs 231, 232 and 235, 236. What is achieved as a result is that the current flow 299 flows from the current source 203 of the branch 291 through the differential transistor pair 221, 222 towards the branch 292 and there through the differential transistor pairs 231, 232; 235, 236. What can be achieved as a result is that the switching of the transistor pair 221, 222 influences the operation of the transistor pairs 231, 232; 235, 236.

The branch 291 has load resistors 271, 272. The branch 292 has load resistors 275, 276.

By way of example, given a voltage drop across the load resistors 271, 272 of the branch 291 and respectively across the load resistors 275, 276 of the branch 292 in each case of $V_{load}$=0.15 V and a voltage drop across the current sources 203 of $V_{tail}$=0.15 V with a base-emitter voltage of $V_{be}$=0.8 V, a supply voltage of just $V_{CC}$=$V_{load}$+$V_{tail}$+$V_{be}$+$V_{rd}$=1.2 V or greater could be achieved, wherein $V_{rd}$=0.1V denotes the voltage drop across the bias resistors 281, 282. FIG. 3 depicts the corresponding DC current flow 298 on which this consideration is based. In general, it would be possible for the circuit 200 to be configured to be operated with a supply voltage $V_{CC}$ of up to 0.7 V or greater, optionally of up to 0.9 V or greater, further optionally of up to 1.2 V or greater. This can be achieved for example by suitable dimensioning of the resistivities of the load resistors 271, 272; 275, 276. This can furthermore be achieved by suitable selection of the transistor technology for the differential transistor pairs 221, 222; 231, 232; 235, 236. This can furthermore be achieved by a suitable implementation of the current source(s).

In order to guide the current flow 299 from the branch 291 to the branch 292, it is possible for a corresponding large impedance at the DC operating point to be generated by means of the load resistors 271, 272 of the branch 291. Furthermore, it may be desirable for the current flow 299 to be conducted by the interface 295 through the differential transistor pairs 231, 232; 235, 236. By way of example, the circuit can be configured to conduct at least 70% of the current flow 299 through the differential transistor pair 221, 222 and through the differential transistor pairs 231, 232; 235, 236, preferably at least 90%, particularly preferably at least 95%. To that end, it may be beneficial if the resistivity of the load resistors 271, 272 is dimensioned to be greater than the resistivity of the load resistors 275, 276.

By way of example, it would be possible for the resistivity of the load resistors 271, 272 to be greater than the resistivity of the load resistors 275, 276 at least by a factor of five, preferably by at least a factor of 10, particularly preferably at least by a factor of 20. A particularly good guidance of the current flow 299 as described above can be achieved in this way.

As a result, it is possible to realize a particularly low input resistance or a particularly low input impedance into the branch 292. By way of example, each of the load resistors 271, 272 could have a resistivity which is less than the input resistance of the branch 292 at least by a factor of 2, preferably at least by a factor of 5, particularly preferably at least by a factor of 10.

In one example, the resistivity of each of the load resistors 271, 272 can be at least 0.2 kohm, preferably at least 0.8 kohm, particularly preferably at least 1 kohm.

In the example in FIG. 3, the branch 292 also comprises the bias resistors 281, 282, which are respectively arranged between the differential transistor pairs 231, 232; 235, 236 and the current sources 203 or the earth terminals 202. What can be achieved in turn by means of the bias resistors 281, 282 is that a high impedance in the direction of the earth terminal 202 is generated in any case at the DC operating point. As a result, it may be possible to conduct the current flow 299 towards the differential transistor pairs 231, 232; 235, 236.

By way of example, the resistivity of each of the bias resistors 281, 282 could be at least 1 kohm, preferably at least 5 kohm, particularly preferably at least 20 kohm.

In order to direct the current flow through the transistors 231, 232 within the branch 292, it may be desirable for the resistivities of the bias resistors 281, 282 to be greater than the resistivities of the load resistors 275, 276. By way of example, in the various examples described here, it would be possible for the resistivities of the bias resistors 281, 282 to be greater than the resistivities of each of the load resistors 275, 276 at least by a factor of 2, preferably by a factor of 5, particularly preferably by a factor of 10. What can be achieved as a result is that the impedance in the direction of the bias resistors 281, 282 is in each case significantly greater than the impedance in the direction of the emitters of the transistors 231, 232. As a result, the current flow 299 is conducted through the transistors 231, 232.

Figure 4:
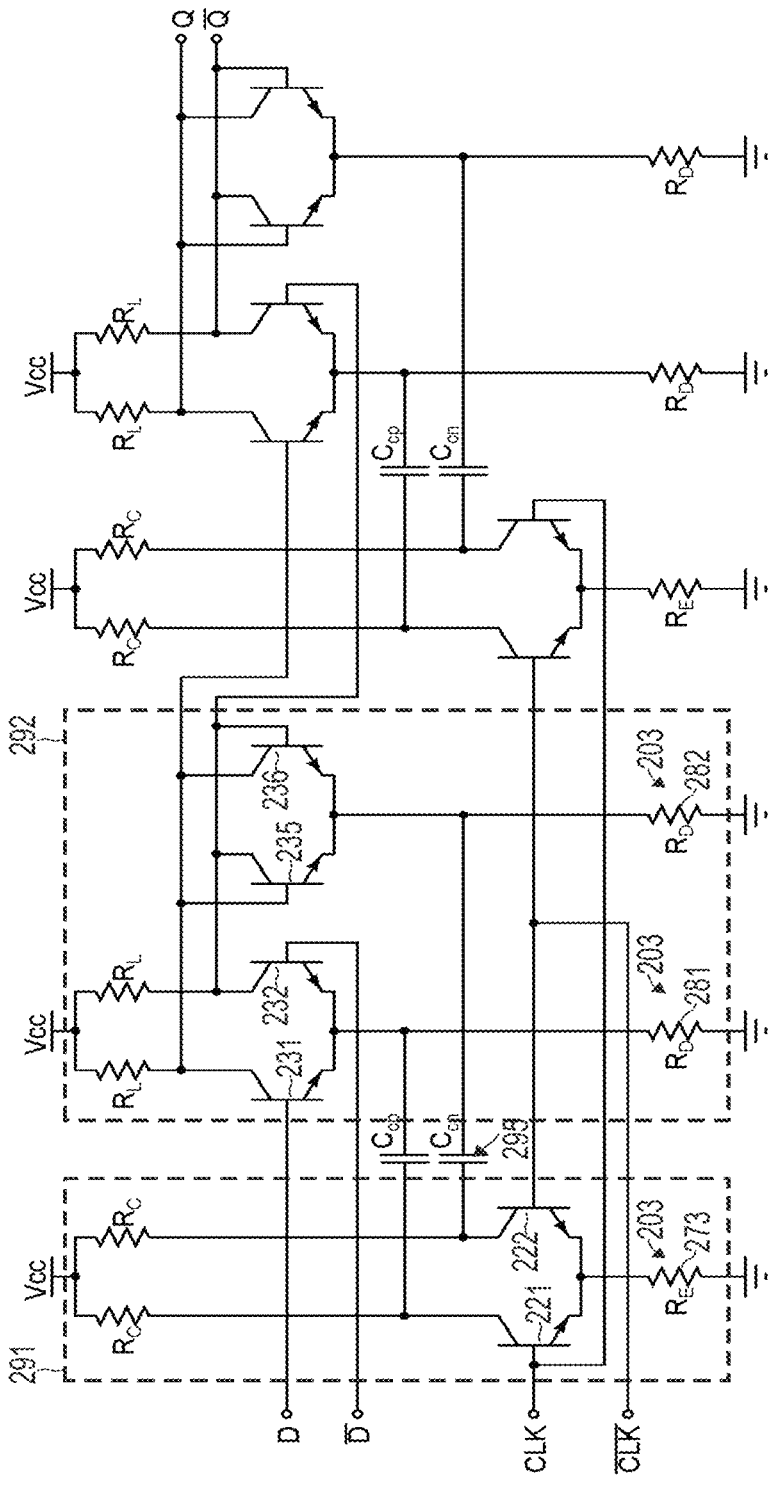
FIG. 4 schematically illustrates a frequency divider circuit in accordance with various embodiments which comprises the circuit from FIG. 3.

FIG. 4 illustrates aspects with regard to an application of the circuit 200 from FIG. 3. In FIG. 4 the circuit 200 is used to implement a frequency divider. In this case, FIG. 4 corresponds in principle to FIGS. 2A and 2B.

In the example in FIG. 4, the bias resistors 281, 282 furthermore implement the current sources. The branch 291 also has a bias resistor 273 that implements the corresponding current source.

In the branch 291, in some examples it is not necessary for the differential transistor pair 221, 222 to have a low input impedance in the direction of the earth terminal: it may therefore be desirable for the resistivity of the bias resistor 273 to be dimensioned to be comparatively low, in particular to be dimensioned to be lower than the resistivities of the bias resistors 281, 282 of the branch 292. Specifically, what can be achieved as a result is that a low supply voltage $V_{CC}$ can be used since the voltage drop across the bias resistor 273 is comparatively small. By way of example, the resistivity of the bias resistors 281, 282 could be greater than the resistivity of the bias resistor 273 in each case at least by a factor of 5, preferably at least by a factor of 10, particularly preferably at least by a factor of 20.

By way of example, given a voltage drop across the load resistors 271, 272 of the branch 291 and respectively across the load resistors 275, 276 of the branch 292 of $V_{load}=0.15$ V with a base-emitter voltage of $V_{be}=0.8$ V, a supply voltage of just $V_{CC}=V_{load}+V_{be}+V_{rd}=1.05$ V could be achieved. PSRR and CMRR can be reduced in a corresponding example.

Figure 5:
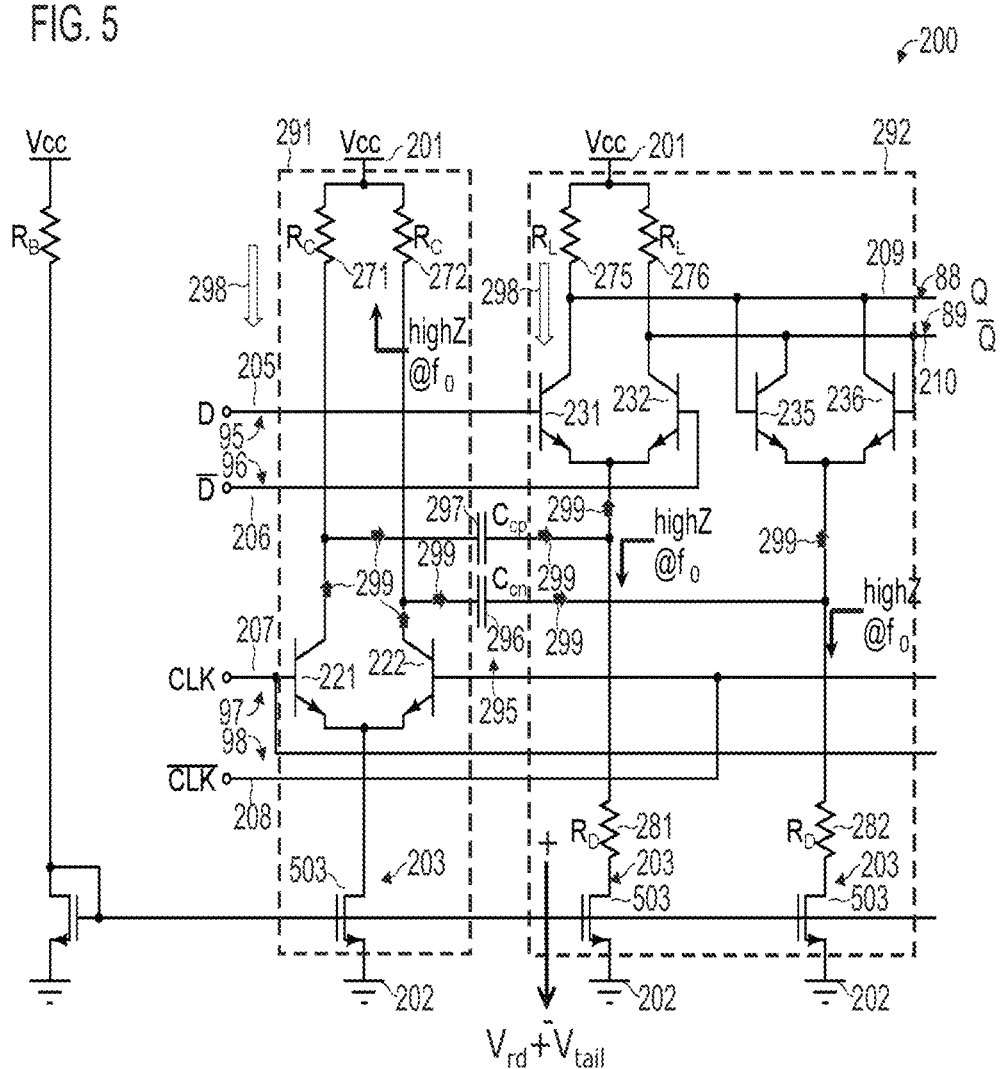
FIG. 5 schematically illustrates a circuit in accordance with various embodiments.

FIG. 5 illustrates aspects of a circuit 200 having a plurality of branches 291, 292 for the various differential inputs 205-208. FIG. 5 shows, in particular, an implementation of the current sources 203 by means of MOSFETs 503. Otherwise, the circuit 200 in accordance with FIG. 5 corresponds in principle to the circuit 200 in accordance with FIG. 3. A high PSRR and CMRR can be achieved as a result.

Figure 6:
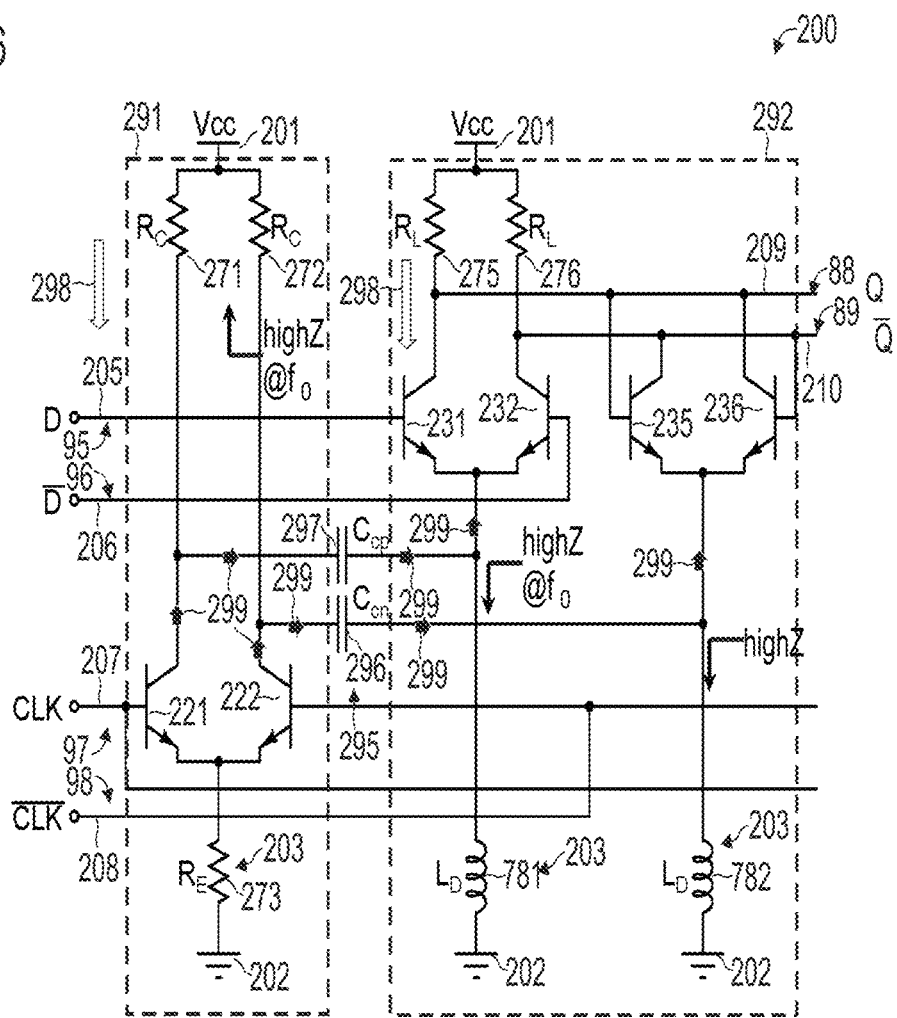
FIG. 6 schematically illustrates a circuit in accordance with various embodiments.

FIG. 6 illustrates aspects of a circuit 200 having a plurality of branches 291, 292 for the various differential inputs 205-208. FIG. 6 shows, in particular, an implementation of the branch 292 with bias inductances 781, 782. Furthermore, the circuit 200 in accordance with FIG. 6 corresponds in principle to the circuit 200 in accordance with FIG. 3.

The bias inductances 781, 782 in turn implement the current sources 203. In other examples it would be possible to provide, in addition to the bias inductances 781, 782, separate current sources 203, for example by using MOSFETs 503 (cf. FIG. 5).

The bias inductances 781, 782 have the effect that there is a significant impedance in the branch 292 from the interface 295 to the earth terminal 202. This has the effect, in a manner comparable to the scenario in FIG. 3, that the current flow 299 flows through the transistor pairs 231, 232; 235, 236.

The bias inductances 781, 782 have no significant DC resistivity. $V_{rd}=0$, i.e. the voltage drop across the bias inductances 781, 782 is 0 volts, such that no headroom is lost. For high frequencies, the resistivity can be in the region of a few hundred ohms. As a result, it is possible to apply an even lower supply voltage $V_{CC}$ at the voltage supply 201.

By way of example, given a voltage drop across the load resistors 271, 272 of the branch 291 and respectively across the load resistors 275, 276 of the branch 292 of $V_{load}=0.15$ V with a base-emitter voltage of $V_{be}=0.8$ V, a supply voltage of just $V_{CC}=V_{load}+V_{be}=0.95$ V could be achieved.

At the same time, however, an increased space requirement for the integration of the bias inductances 781, 782 may result in comparison with implementations which have bias resistors.

Figure 7:
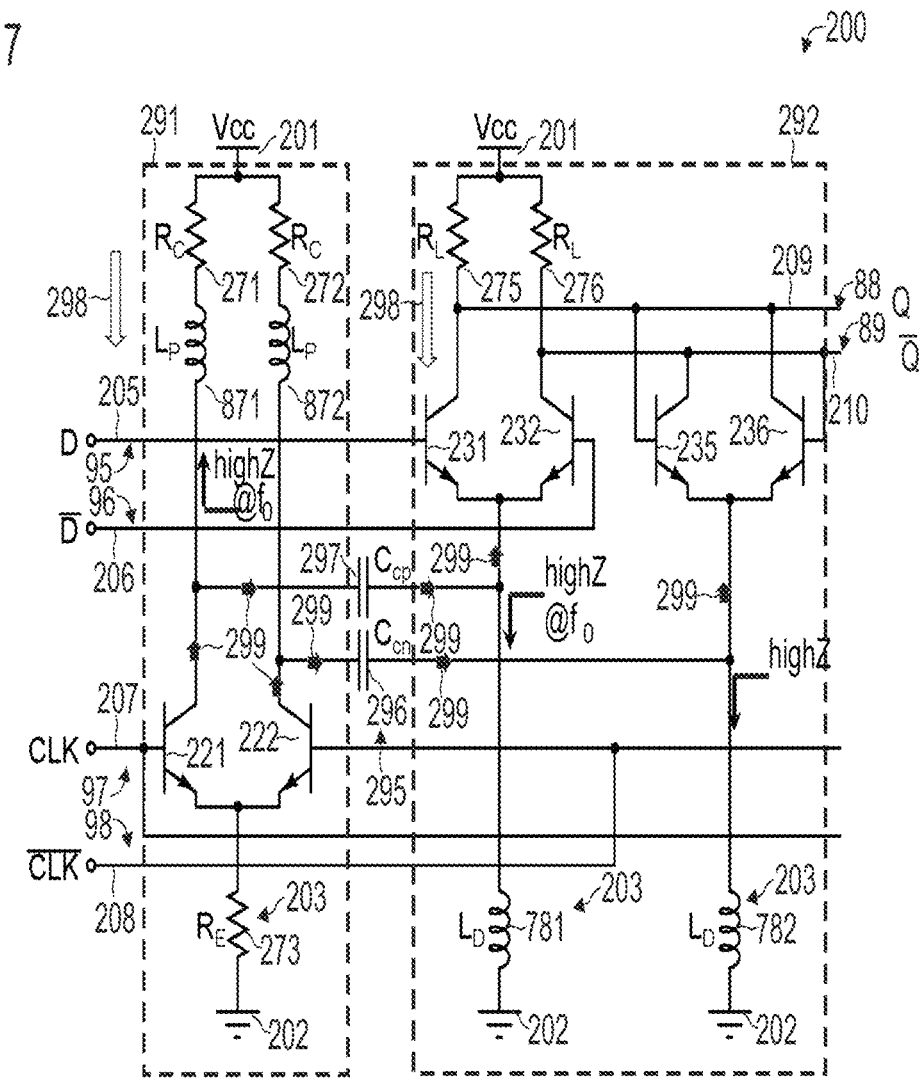
FIG. 7 schematically illustrates a circuit in accordance with various embodiments.

FIG. 7 illustrates aspects of a circuit 200 having a plurality of branches 291, 292 for the various differential inputs 205-208. FIG. 7 shows, in particular, an implementation with load inductances 871, 872 in the branch 291. The circuit 200 in accordance with the implementation in FIG. 7 corresponds in principle to the circuit 200 in accordance with the implementation in FIG. 6. In this case, the use of the load inductances 871, 872 increases the impedance with respect to the voltage supply 201 proceeding from the interface 295. This has the effect that the current flow 299 flows from the differential transistor pair 221, 222 through the interface 295. At the same time, the load inductances 871, 872 have no significant DC resistivity; therefore, the load inductances 871, 872 do not alter the minimum available supply voltage at the voltage supply 201.

Figure 8:
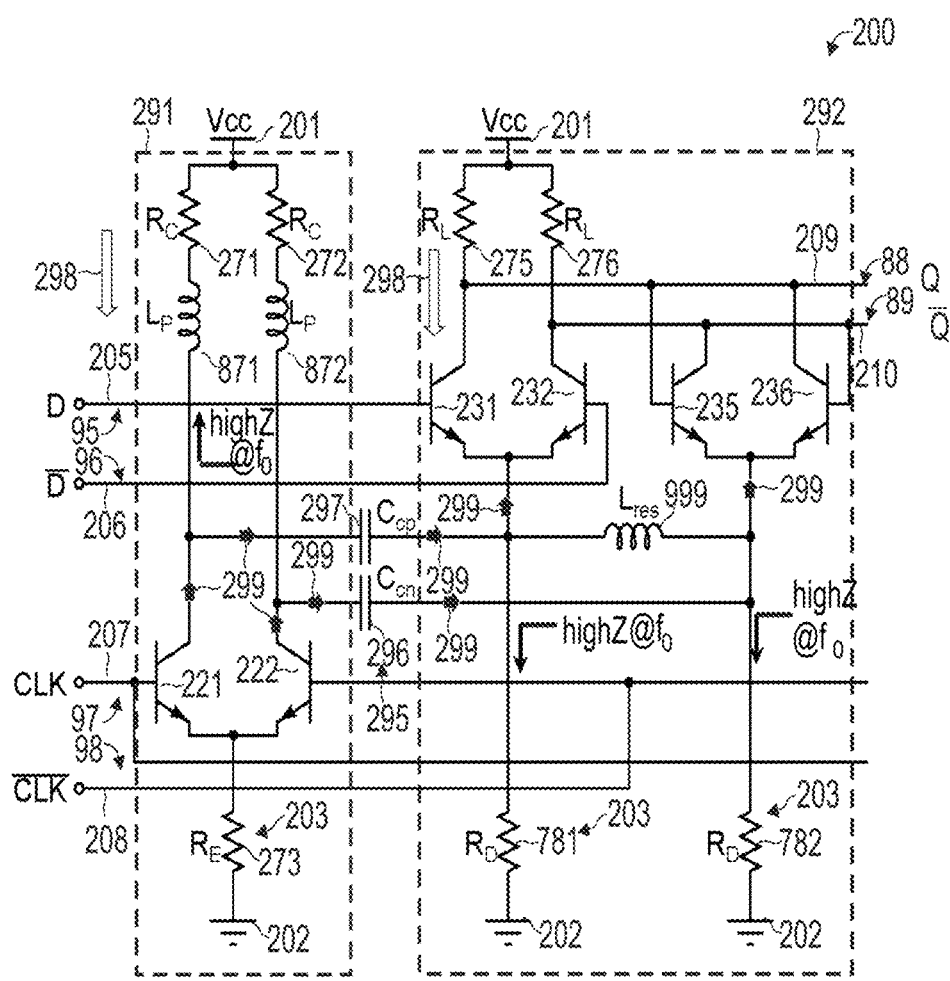
FIG. 8 schematically illustrates a circuit in accordance with various embodiments.

FIG. 8 illustrates aspects of a circuit 200 having a plurality of branches 291, 292 for the various differential inputs 205-208. FIG. 8 shows, in particular, an implementation with an additional inductance 999, which couples the two parallel-connected differential transistor pairs 231, 232; 235, 236 to one another on the earth side. The inductance 999 makes it possible to shift parasitic influences of the capacitors 296, 297 into a spectral range that does not interfere with the actual signal.

In the example in FIG. 8, the current sources 203 are implemented by bias resistors 273, 781, 782. However, it would also be possible, for example, for bias inductances 781, 782 to be used (not illustrated in FIG. 8) in a manner corresponding to the implementations in FIGS. 6 and 7.

Various examples referring to a latch logic have been described above. In this case, however, it is possible to apply corresponding techniques to other circuits having other logic functionality.

Figure 9:
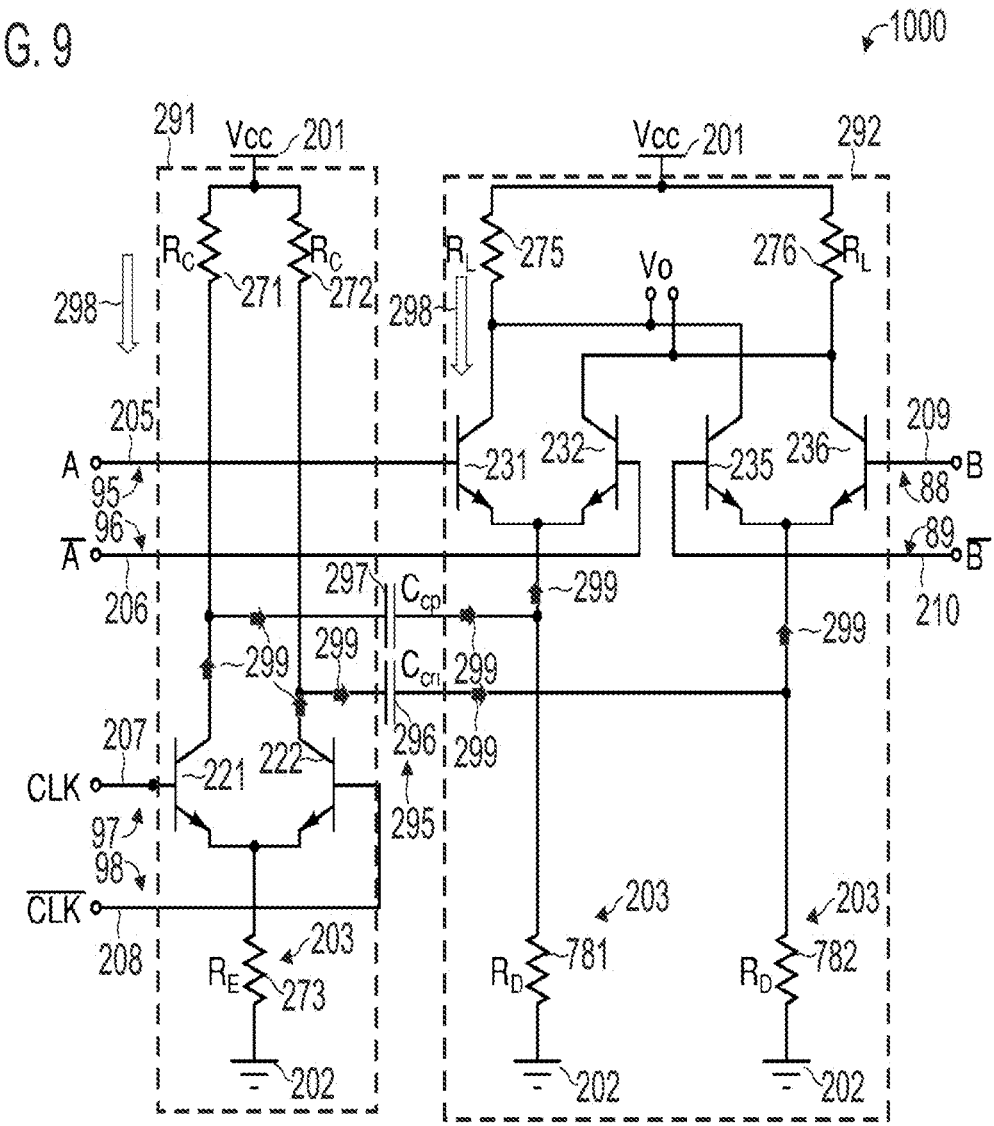
FIG. 9 schematically illustrates a circuit in accordance with various embodiments.

FIG. 9 illustrates aspects of a circuit moo, having a plurality of branches 291, 292 for the various differential inputs 205-208. The circuit 1000 implements a 2:1 multiplexer logic.

Various examples using HBTs as switching elements have been described above. However, these examples can also be used with the use of MOSFETs. The use of MOSFETs can make it possible to achieve even lower supply voltages. By way of example, it may be possible to achieve supply voltages of less than 0.7 V. Such low supply voltages also make it possible to use highly integrated CMOS technologies, for example with gate lengths of 28 nm, 14 nm, etc. In FIGS. 3-9, therefore, field effect transistors can also be used instead of the bipolar transistors 221, 222; 231, 232; 235, 236 illustrated.

Figure 10:
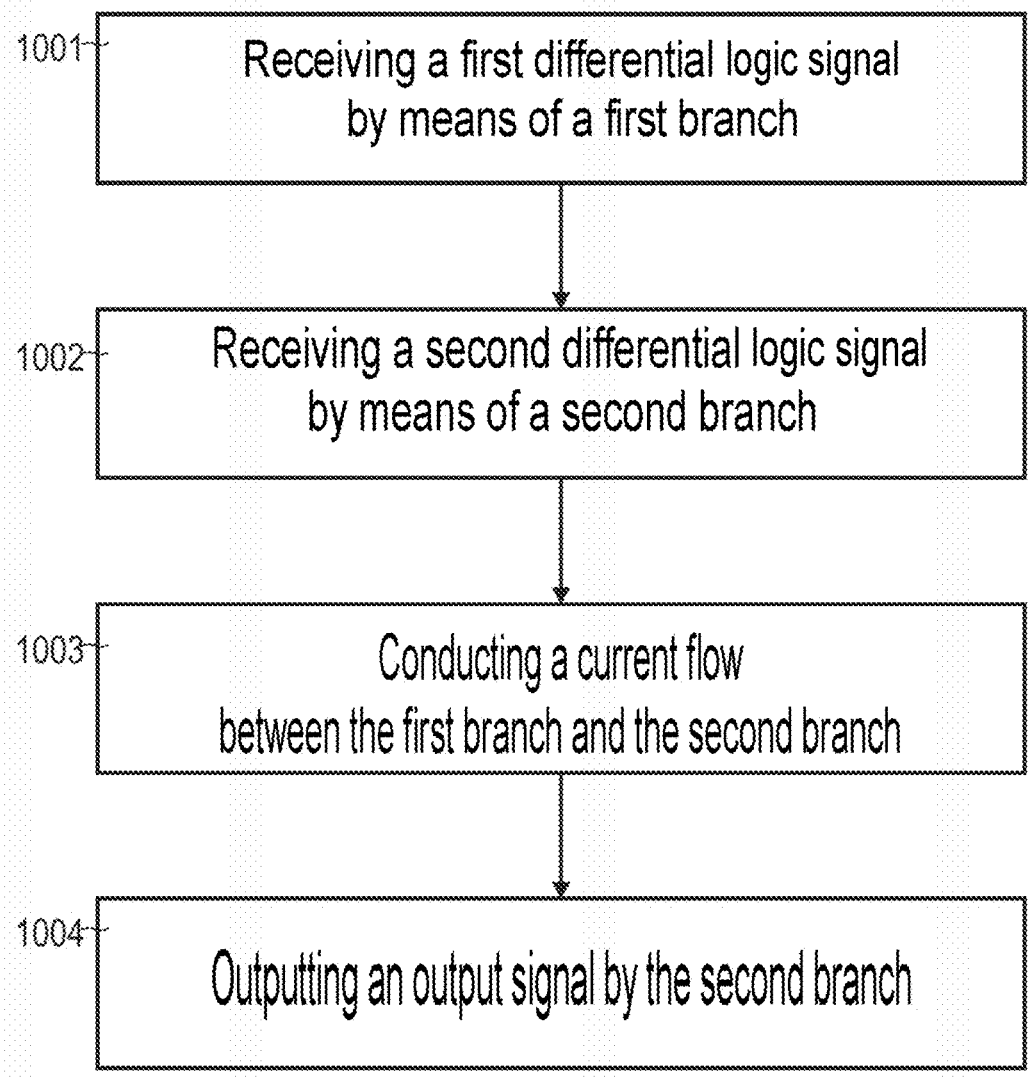
FIG. 10 is a flow diagram of a method in accordance with various embodiments.

FIG. 10 is a flow diagram of one exemplary method. Step 1001 involves receiving a first differential logic signal by means of a first branch. To that end, it is possible for example to use an input terminal configured to receive differential signals.

Step 1002 involves receiving a second differential logic signal by means of a second branch. To that end, it is possible in turn to use for example an input terminal configured to receive differential signals.

Step 1003 involves conducting a current flow between the first branch and the second branch. In particular, it may be possible for an AC current flow to be conducted in step 1003; at the same time, the first branch and the second branch can be DC-decoupled.

Step 1004 involves outputting an output signal, for example a differential logic signal, by the second branch. In this case, the output signal can be determined by a suitable circuit on the basis of the first and second differential logic signals.

In the example in FIG. 10, the first branch and the second branch can be arranged in parallel with one another between a voltage supply and an earth terminal (cf. FIGS. 3-9). It is possible for the first branch to have at least one first differential transistor pair; at the same time, the first branch cannot have more than one cascaded-connected transistor. Correspondingly, it would be possible for the second branch to have at least one second differential transistor pair; at the same time, the second branch cannot have more than one cascaded-connected transistor. By way of example, the second branch could have a plurality of parallel-connected differential transistor pairs. By way of example, a transistor pair of the second branch could be cross-coupled.

To summarize, a description has been given above of techniques which enable fast logic circuits having a low DC energy consumption. These techniques have, in particular, the advantage of a low supply voltage, e.g. in comparison with CML-based circuits: the CML typically requires keeping ready a plurality of cascaded-connected transistors, a load resistor and often also a current source between voltage supply and earth terminal. The corresponding voltage drop sets a lower limit for the choice of supply voltage in order to be able to operate the transistors at the desired operating point.

The present techniques are based on dividing the various transistor pairs connected in a cascaded manner in conventional CML between different branches of a circuit. An AC coupling of the branches is implemented by a corresponding interface. At the same time, an impedance into the load of one branch, which impedance is high in any case for the corresponding frequencies of the AC current flow, and a high impedance into the current source of the other branch can guide the AC current flow through the now separated transistor pairs. What can be achieved by smaller dimensioning of the load resistors of the branch arranged downstream of the interface is that the AC current flow flows through the transistor pair of this branch: this transistor pair then has a low input impedance.

It goes without saying that the features of the above-described embodiments and aspects of the invention can be combined with one another. In particular, the features can be used not only in the combinations described, but also in other combinations or by themselves, without departing from the field of the invention.

The following examples are preferred embodiments of the invention.

Example 1

A circuit (200, 1000), comprising:
- a voltage supply (201),
- an earth terminal (202),
- a first input terminal (207, 208) configured to receive a first differential logic signal,
- a second input terminal (205, 206) configured to receive a second differential logic signal,
- a first branch (291), which extends from the voltage supply (201) to the earth terminal (202) and has at least one first differential transistor pair (221, 222), wherein the first branch (291) is coupled to the first input terminal (207, 208),
- a second branch (292), which extends from the voltage supply (201) to the earth terminal (202) and has at least one second differential transistor pair (231, 232, 235, 236), wherein the second branch (292) is coupled to the second input terminal (205, 206),
- an interface (295) between the first branch (291) and the second branch (292), said interface being configured to conduct a current flow (299) between the first branch (291) and the second branch (292), and
- an output terminal (209, 210) which is coupled to the second branch (292) and which is configured to output an output signal.

Example 2

The circuit (200, 1000) according to Example 1, wherein the interface (295) comprises a first conductor with a first capacitor (296) and a second conductor with a second capacitor (297).

Example 3

The circuit (200, 1000) according to Example 1 or 2, wherein the interface (295) is configured to conduct a differential AC current flow (299) between the first branch (291) and the second branch (292).

Example 4

The circuit (200, 1000) according to any one of the preceding examples,
- wherein the interface (295) is coupled to the first branch (291) between the voltage supply (201) and the at least one first differential transistor pair (221, 222), and
- wherein the interface (295) is coupled to the second branch (292) between the earth terminal (202) and the at least one second differential transistor pair (231, 232, 235, 236).

Example 5

The circuit (200, 1000) according to any one of the preceding examples, wherein the first branch (291) has a first load resistor (271, 272), wherein the second branch (292) has a second load resistor (275, 276), and wherein the resistivity of the first load resistor (271, 272) is greater than the resistivity of the second load resistor (275, 276), preferably by at least a factor of 5, particularly preferably by at least a factor of 10.

Example 6

The circuit (200, 1000) according to any one of the preceding examples, wherein the first branch (291) has a first load resistor (271, 272) having a resistivity of at least 0.2 kohm, preferably of at least 0.8 kohm, particularly preferably of at least 1 kohm.

Example 7

The circuit (100, 1000) according to any one of the preceding examples, wherein the first branch (291) has a first load resistor (271, 272), and wherein a resistivity of the first load resistor (271, 272) is less than an input resistance of the second branch (292) at least by a factor of 2, preferably at least by a factor of 5, particularly preferably at least by a factor of 10.

Example 8

The circuit (200, 1000) according to any one of the preceding examples, wherein the first branch (291) has a first bias resistor (273), wherein the second branch (292) has a second bias resistor (281, 282), wherein the resistivity of the second bias resistor (281, 282) is greater than the resistivity of the first bias resistor (273), preferably at least by a factor of 5, particularly preferably at least by a factor of 10.

Example 9

The circuit (200, 1000) according to any one of the preceding examples, wherein the second branch (292) has a second load resistor (275, 276) and a second bias resistor (281, 282), and wherein the resistivity of the second load resistor (275, 276) is less than the resistivity of the second bias resistor (281, 282) at least by a factor of 2, preferably by at least a factor of 5, particularly preferably by at least a factor of 10.

Example 10

The circuit (200, 1000) according to any one of the preceding examples, wherein the second branch (292) has a second bias resistor (281, 282) having a resistivity of at least 1 kohm, preferably of at least 5 kohm, particularly preferably of at least 20 kohm.

Example 11

The circuit (200, 1000) according to any one of the preceding examples, wherein the first branch (291) has a load inductance (871, 872), and/or wherein the second branch (292) has a bias inductance (781, 782).

Example 12

The circuit (200, 1000) according to any one of the preceding examples, wherein the circuit (200, 1000) is configured to be operated with a supply voltage of 0.7 V or greater, optionally of 0.9 V or greater, further optionally of up to 1.2 V or greater, and wherein the supply voltage is received via the voltage supply (201).

Example 13

The circuit (200, 1000) according to any one of the preceding examples, wherein the first branch (291) between the voltage supply (201) and the earth terminal (202) does not comprise a series connection of bipolar transistors, and/or wherein the second branch (292) between the voltage supply (201) and the earth terminal (202) does not comprise a series connection of bipolar transistors.

Example 14

The circuit (200) according to any one of the preceding examples, wherein the circuit (200) is a latch register, wherein the second branch (292) comprises two second differential transistor pairs (231, 232, 235, 236) connected in parallel, and wherein one of the two second differential transistor pairs (231, 232, 235, 236) is cross-coupled.

Example 15

The circuit (200) according to Examples 2 and 14, wherein the first conductor of the interface (295) is coupled to a first of the two second differential transistor pairs (231, 232, 235, 236), and wherein the second conductor of the interface (295) is coupled to a second of the two second differential transistor pairs (231, 232, 235, 236).

Example 16

The circuit (200) according to Example 14 or 15, wherein the two parallel-connected second differential transistor pairs (231, 232, 235, 236) are coupled to one another via an inductance (999) on the earth side.

Example 17

The circuit (200) according to any one of the preceding examples, which furthermore comprises:

a first current source (203), which is coupled to the first branch (291) on the earth side, and a second current source (203), which is coupled to the second branch (292) on the earth side, wherein at least one of the first current source (203) and the second current source (203) comprises a metal oxide field effect transistor.

Example 18

The circuit (200, 1000) according to any one of the preceding examples, wherein the circuit (200, 1000) is configured to conduct at least 70% of the current flow (299) through the at least one first differential transistor pair (221, 222) and through the at least one second differential transistor pair (231, 232, 235, 236), preferably at least 90%, particularly preferably at least 95%.

Example 19

A method, comprising:
receiving a first differential logic signal by means of a first branch of a circuit, which first branch extends from a voltage supply of the circuit as far as an earth terminal of the circuit and has at least one first differential transistor pair,
receiving a second differential logic signal by means of a second branch of the circuit, which second branch extends from the voltage supply to the earth terminal and has at least one second differential transistor pair,
conducting a current flow between the first branch and the second branch, and
outputting an output signal by the second branch.

Example 20

The method according to Example 19, wherein the method is performed by the circuit according to any one of Examples 1-18.

What is claimed is:

1. A circuit, comprising:
a voltage supply terminal;
an earth terminal;
a first input terminal configured to receive a first differential logic signal;
a second input terminal configured to receive a second differential logic signal;
a first branch, which extends from the voltage supply terminal to the earth terminal and has at least one first differential transistor pair, wherein the first branch is coupled to the first input terminal;
a second branch, which extends from the voltage supply terminal to the earth terminal and has at least one second differential transistor pair, wherein the second branch is coupled to the second input terminal;
an interface between the first branch and the second branch, said interface being configured to conduct a current flow between the first branch and the second branch, wherein the interface comprises a first conductor with a first capacitor and a second conductor with a second capacitor; and
an output terminal which is coupled to the second branch and which is configured to output an output signal.

2. The circuit according to claim 1,
wherein the circuit is a latch register;
wherein the second branch comprises two second differential transistor pairs connected in parallel; and
wherein one of the two second differential transistor pairs is cross coupled.

3. The circuit according to claim 2,
wherein the first conductor of the interface is coupled to a first of the two second differential transistor pairs; and
wherein the second conductor of the interface is coupled to a second of the two second differential transistor pairs.

4. The circuit according to claim 2, wherein the two second differential transistor pairs are coupled to one another via an inductance on a first side of the two second differential transistor pairs that is coupled to the earth terminal.

5. The circuit according to claim 4, further comprising:
a first current source which is coupled to the first branch on the first side; and
a second current source, which is coupled to the second branch on the first side, wherein at least one of the first current source and the second current source comprises a metal oxide field effect transistor.

6. The circuit according to claim 1, wherein the interface is configured to conduct a differential AC current flow between the first branch and the second branch.

7. The circuit according to claim 1,
wherein the interface is coupled to the first branch between the voltage supply terminal and the at least one first differential transistor pair; and
wherein the interface is coupled to the second branch between the earth terminal and the at least one second differential transistor pair.

8. The circuit according to claim 1,
wherein the first branch has a first load resistor;
wherein the second branch has a second load resistor; and
wherein a resistance of the first load resistor is greater than a resistance of the second load resistor, by at least a factor of 5.

9. The circuit according to claim 1, wherein the first branch has a first load resistor having a resistance of at least 0.2 kohm.

10. The circuit according to claim 1,
wherein the first branch has a first load resistor; and
wherein a resistance of the first load resistor is less than an input resistance of the second branch at least by a factor of 2.

11. The circuit according to claim 1,
wherein the first branch has a first bias resistor;
wherein the second branch has a second bias resistor; and
wherein a resistance of the second bias resistor is greater than a resistance of the first bias resistor at least by a factor of 5.

12. The circuit according to claim 1,
wherein the second branch has a second load resistor and a second bias resistor; and
wherein a resistance of the second load resistor is less than a resistance of the second bias resistor at least by a factor of 2.

13. The circuit according to claim 1, wherein the second branch has a second bias resistor having a resistance of at least 1 kohm.

14. The circuit according to claim 1,
wherein the first branch has a load inductance; or
wherein the second branch has a bias inductance.

15. The circuit according to claim 1,
wherein the circuit is configured to be operated with a supply voltage of 0.7 V or greater; and
wherein the supply voltage is received via the voltage supply terminal.

16. The circuit according to claim 1,
wherein the first branch between the voltage supply terminal and the earth terminal does not include a series connection of bipolar transistors; or
wherein the second branch between the voltage supply terminal and the earth terminal does not includes a series connection of bipolar transistors.

17. The circuit according to claim 1, wherein the circuit is configured to conduct at least 70% of the current flow through the at least one first differential transistor pair and through the at least one second differential transistor pair.

18. A method, comprising:
receiving a first differential logic signal using a first branch of a circuit, which first branch extends from a voltage supply terminal of the circuit as far as an earth terminal of the circuit and has at least one first differential transistor pair;
receiving a second differential logic signal using a second branch of the circuit, which second branch extends from the voltage supply terminal to the earth terminal and has at least one second differential transistor pair;
conducting a current flow between the first branch and the second branch via an interface comprising a first conductor with a first capacitor and a second conductor with a second capacitor; and
outputting an output signal by the second branch.

19. A frequency divider circuit comprising:
a clock input circuit comprising a first differential pair of transistors having control nodes coupled to a clock input, first load resistors coupled to output nodes of the first differential pair of transistors, and a first current source connected between a first common node of the first differential pair of transistors and an earth reference terminal;
a first interface capacitor having a first terminal coupled to a first output node of the first differential pair of transistors, and a second interface capacitor having a first terminal coupled to a second output node of the first differential pair of transistors;
a latch circuit comprising
a second differential pair of transistors having a second common node coupled to a second terminal of the first interface capacitor,
a second current source connected between the second common node of the second differential pair of transistors and the earth reference terminal,
second load resistors coupled to output nodes of the second differential pair of transistors,
a third differential pair of transistors having a third common node coupled to a second terminal of the second interface capacitor, the third differential pair of transistors cross-coupled to the second differential pair of transistors, and
a third current source connected between the third common node of the third differential pair of transistors and the earth reference terminal.

20. The frequency divider circuit of claim 19, further comprising an inductor coupled between the second common node of the second differential pair of transistors and the third common node of the third differential pair of transistors, wherein an inductance of the inductor is configured to shift a parasitic influence of the first interface capacitor and the second interface capacitor to reduce interference with a signal of the frequency divider circuit.

21. A circuit, comprising:
a voltage supply terminal;
an earth terminal;
a first input terminal configured to receive a first differential logic signal;
a second input terminal configured to receive a second differential logic signal;
a first branch, which extends from the voltage supply terminal to the earth terminal and has at least one first differential transistor pair, wherein the first branch is coupled to the first input terminal;
a second branch, which extends from the voltage supply terminal to the earth terminal and has at least one second differential transistor pair, wherein the second branch is coupled to the second input terminal;
an interface between the first branch and the second branch, said interface being configured to conduct a current flow between the first branch and the second branch; and
an output terminal which is coupled to the second branch and which is configured to output an output signal,
wherein the interface is coupled to the first branch between the voltage supply terminal and the at least one first differential transistor pair, and
wherein the interface is coupled to the second branch between the earth terminal and the at least one second differential transistor pair.

22. A method of operating a frequency divider circuit comprising a clock input circuit comprising a first differential pair of transistors having control nodes coupled to a clock input, first load resistors coupled to output nodes of the first differential pair of transistors, and a first current source connected between a first common node of the first differential pair of transistors and an earth reference terminal; a first interface capacitor having a first terminal coupled to a first output node of the first differential pair of transistors, and a second interface capacitor having a first terminal coupled to a second output node of the first differential pair of transistors; a latch circuit comprising a second differential pair of transistors having a second common node coupled to a second terminal of the first interface capacitor, a second current source connected between the second common node of the second differential pair of transistors and the earth reference terminal, second load resistors coupled to output nodes of the second differential pair of transistors, a third differential pair of transistors having a third common node coupled to a second terminal of the second interface capacitor, the third differential pair of transistors cross-coupled to the second differential pair of transistors, and a third current source connected between the third common node of the third differential pair of transistors and the earth reference terminal, wherein the method comprises:
receiving, at the clock input, a clock signal; and
generating a divided clock signal at the output nodes of the second differential pair of transistors.

23. A method of operating a circuit, comprising a voltage supply terminal; an earth terminal; a first input terminal configured to receive a first differential logic signal; a second input terminal configured to receive a second differential logic signal; a first branch, which extends from the voltage supply terminal to the earth terminal and has at least one first differential transistor pair, wherein the first branch is coupled to the first input terminal; a second branch, which extends from the voltage supply terminal to the earth terminal and has at least one second differential transistor pair, wherein the second branch is coupled to the second input terminal; an interface between the first branch and the second branch, said interface being configured to conduct a current flow between the first branch and the second branch; and an output terminal which is coupled to the second branch and which is configured to output an output signal, wherein the interface is coupled to the first branch between the voltage supply terminal and the at least one first differential transistor pair, and wherein the interface is coupled to the second branch between the earth terminal and the at least one second differential transistor pair, the method comprising:
   receiving the first differential logic signal at the first input terminal;
   receiving the second differential logic signal at the second input terminal; and
   outputting the output signal by the output terminal.

* * * * *